(12) United States Patent
Wittkop (10) Patent No.: US 8,963,015 B2
(45) Date of Patent: Feb. 24, 2015

(54) CAPACITOR COUPLED CABLE SHIELD FEEDTHROUGH

(75) Inventor: Adam Joseph Wittkop, Marshalltown, IA (US)

(73) Assignee: Fisher Controls International LLC, Marshalltown, ID (US)

( * ) Notice: Subject to any disclaimer, the term of this patent is extended or adjusted under 35 U.S.C. 154(b) by 559 days.

(21) Appl. No.: 13/008,622

(22) Filed: Jan. 18, 2011

(65) Prior Publication Data

US 2012/0181079 A1   Jul. 19, 2012

(51) Int. Cl.
| | |
|---|---|
| H05K 1/16 | (2006.01) |
| H05K 9/00 | (2006.01) |
| H01G 4/35 | (2006.01) |
| H02G 3/06 | (2006.01) |

(52) U.S. Cl.
CPC ............... *H05K 9/0018* (2013.01); *H01G 4/35* (2013.01); *H02G 3/0666* (2013.01)
USPC ......... 174/260; 174/75 C; 174/78; 361/301.2; 361/302; 361/321.6; 29/857

(58) Field of Classification Search
USPC ..... 174/360, 75 C, 78, 74 R, 260; 361/321.6, 361/203, 301.2; 333/245; 29/25.41, 868, 29/854, 857, 867, 564.4, 564.5
See application file for complete search history.

(56) References Cited

U.S. PATENT DOCUMENTS

| | | | | | |
|---|---|---|---|---|---|
| 3,793,477 | A | * | 2/1974 | Wagenaar | 174/143 |
| 4,267,529 | A | * | 5/1981 | Brun et al. | 333/12 |
| 4,329,733 | A | * | 5/1982 | Ito et al. | 361/302 |
| 4,387,266 | A | * | 6/1983 | Matthaus | 174/31 R |
| 4,642,589 | A | * | 2/1987 | Chambers | 333/182 |
| 4,741,710 | A | * | 5/1988 | Hogan et al. | 439/620.12 |
| 6,008,980 | A | * | 12/1999 | Stevenson et al. | 361/302 |
| 6,319,197 | B1 | * | 11/2001 | Tsuji et al. | 600/132 |
| 6,395,977 | B1 | * | 5/2002 | Yamamoto | 174/36 |
| 6,453,551 | B1 | * | 9/2002 | Nordquist et al. | 29/862 |
| 6,686,538 | B2 | * | 2/2004 | Yamamoto | 174/36 |
| 7,173,182 | B2 | * | 2/2007 | Katsuyama et al. | 174/36 |
| 7,180,392 | B2 | * | 2/2007 | Grothen et al. | 333/245 |

(Continued)

FOREIGN PATENT DOCUMENTS

| | | |
|---|---|---|
| DE | 33 45 942 A1 | 7/1985 |
| DE | 42 26 463 A1 | 2/1994 |
| DE | 44 45 406 C1 | 3/1996 |

OTHER PUBLICATIONS

"EMI Filters," Ceramic & Microwave Products, 2010, www.dovercmp.com, 44 pages.
Schlicke, H.M., "Discoidal vs. Tubular Feed-Through Capacitors," Proceedings of the IRE, Feb. 1955, 5 pages.
"Spectrum Advanced Specialty Products," Spectrum Control, Inc., 2010, 72 pages.

(Continued)

Primary Examiner — Lisa Lea Edmonds
Assistant Examiner — Christopher L Augustin
(74) Attorney, Agent, or Firm — Marshall, Gerstein & Borun LLP (57) ABSTRACT

Shielding performance and protection from radiated RF energy at a cable's point of entry to an enclosure are improved when a shield of the cable is AC coupled around an entire opening of the enclosure using a discoidal capacitor. The capacitor may be electrically coupled to the shield and the enclosure around the entire inner and outer circumferences of the discoidal capacitor. Compared to traditional DC coupling or the use of a drain wire and traditional capacitor, using the discoidal capacitor lowers inductance and improves shielding of the opening itself while improving AC filtering characteristics and preventing ground loops.

19 Claims, 7 Drawing Sheets

(56) References Cited

U.S. PATENT DOCUMENTS

| | | | |
|---|---|---|---|
| 7,906,730 B2 * | 3/2011 | Atkinson et al. | 174/78 |
| 7,939,752 B2 * | 5/2011 | Sjoberg et al. | 174/142 |
| 2010/0081302 A1 | 4/2010 | Atkinson et al. | |

OTHER PUBLICATIONS

Search Report for PCT/US2011/063358, mailed Mar. 20, 2012.
Written Opinion for PCT/US2011/063358, mailed Mar. 20, 2012.

* cited by examiner

Fig. 8

CAPACITOR COUPLED CABLE SHIELD FEEDTHROUGH

FIELD OF THE INVENTION

The disclosure is directed to cable shielding, and more particularly to low inductance AC coupled cable shielding.

BACKGROUND

Radio frequency (RF) energy is a significant source of interference in electronic equipment. Spurious RF signals may be coupled onto signal carriers, circuit boards, and electrical components.

High frequency noise caused by wireless devices and other oscillating equipment can affect signals that are transmitted through wires and cables. This interference can be reduced by filtering the signals within a device or by electrically shielding electronics and cables from the interference. In some applications, filtering of signals is difficult due to the need to pass high frequency communications, and can be further complicated by limitations in capacitance and inductance required by some certifications, such as industry standards for intrinsic safety or other applications. A conductive enclosure that creates a faraday shield can be used to protect the device's electronics, and a shielded cable can be used to protect wiring. However, improper connections between the enclosure and the shield of the cable can eliminate much of the benefit provided by the shielding and introduce new issues such as ground loops.

SUMMARY

One exemplary embodiment includes an apparatus for terminating a shield of a cable to an enclosure comprises the cable having one or more insulated conductors and the shield disposed to surround the one or more insulated conductors and the enclosure having a first wall, wherein the first wall has an opening through which the cable is passed, the enclosure being electrically conductive at the opening. The apparatus further includes a cylindrical capacitor having i. a first terminal disposed around an inner circumference of the cylindrical capacitor wherein the first terminal of the cylindrical capacitor is in substantially continuous contact with the shield of the cable at an outer circumference of the shield; and ii. a second terminal disposed around an outer circumference of the cylindrical capacitor wherein the second terminal of the cylindrical capacitor is in substantially continuous contact at an inner circumference of the opening in the first wall of the enclosure, forming an electrical connection between the cylindrical capacitor and the enclosure. In some embodiments the cylindrical capacitor may have a capacitance range of 1000 picofarads (pf) to 10,000 pf.

One version of this embodiment may have substantially continuous contact of the first terminal of the cylindrical capacitor to the shield of the cable through the use of a solder attachment of the first terminal and the shield of the cable around the outer circumference of the shield. Another version may have substantially continuous contact of the first terminal of the cylindrical capacitor through use of a conductive epoxy attachment of the first terminal and the shield of the cable around the outer circumference of the shield.

The embodiment may provide the substantially continuous contact of the second terminal of the cylindrical capacitor through use of a press fit of the second terminal to fingers of a spring washer, wherein the fingers of the spring washer are disposed around an inner circumference of the spring washer and an outer circumference of the spring washer is uniformly coupled both electrically and mechanically to an inner face of the opening in the enclosure around the inner circumference of the opening in the enclosure.

However, an embodiment may provide the substantially continuous contact of the second terminal of the cylindrical capacitor by using a press fit of the second terminal to an inner face of the opening in the enclosure around the inner circumference of the opening.

In another embodiment, the substantially continuous contact of the second terminal of the cylindrical capacitor may use a solder attachment of the second terminal to an inner face of the opening in the enclosure around the inner circumference of the opening. In some embodiments, the shield of the cable may be a braided electrical filament sheath or a foil wrapper.

Also disclosed is a method of terminating a shield of a cable that involves providing the cable having one or more insulated conductors, the shield that surrounds the insulated conductors along a length of the cable, and an outer insulator that surrounds the shield, providing an enclosure having sides with at least one side having an opening, providing a capacitor in a shape of a cylinder with a center terminal at an inner circumference of the cylinder and a outer terminal at an outer circumference of the cylinder, wherein an inner diameter of the capacitor is approximately equal to an outer diameter of the shield. The method may further involve stripping the outer insulator at one end of the cable to expose the shield, inserting the cable into the capacitor until an exposed portion of the shield overlaps the center terminal of the capacitor around a circumference of the shield, electrically attaching the center terminal of the capacitor to the shield around a circumference of overlap between the center terminal and the shield, inserting the capacitor into the opening in the enclosure; and electrically attaching the outer terminal of the capacitor to the enclosure substantially continuously around an outer circumference of the capacitor.

In one embodiment of the method electrically attaching the center terminal of the capacitor to the shield around the circumference of overlap between the center terminal and the shield may include disposing a substantially continuous solder connection between the center terminal and the shield. In another embodiment, electrically attaching the center terminal of the capacitor to the shield around the circumference of overlap between the center terminal and the shield comprises disposing a substantially continuous conductive epoxy connection between the center terminal and the shield. In yet another embodiment, electrically attaching the outer terminal of the capacitor to the enclosure substantially continuously around the outer circumference of the capacitor may include fitting a spring washer to the opening of the enclosure such that fingers of the spring washer electrically and mechanically contact the shield at intervals around the circumference of the shield.

The method may also include electrically attaching the outer terminal of the capacitor to the enclosure substantially continuously around the outer circumference of the capacitor by press fitting the outer terminal of the capacitor into the opening of the enclosure or disposing the capacitor in the opening of the enclosure and disposing a substantially continuous solder connection between the outer terminal of the capacitor to the enclosure around the outer circumference of the capacitor. Another element of the method may include electrically attaching the outer terminal of the capacitor to the enclosure substantially continuously around the outer circumference of the capacitor by disposing the capacitor in the opening of the enclosure and disposing a substantially continuous conductive epoxy connection between the outer terminal of the capacitor to the enclosure around the outer circumference of the capacitor.

Another embodiment of disclosure may involve a method of providing an AC coupled termination of a shielded cable to an enclosure using a discoidal capacitor, the method that includes providing the shielded cable having one or more inner conductors and a shield that cylindrically encloses the one or more inner conductors, at one end of the shielded cable, attaching a center terminal of the discoidal capacitor to the shield so that the center terminal is in continuous electrical contact with the shield around a circumference of the shield perpendicular to the one or more inner conductors and electrically connecting an outer terminal of the discoidal capacitor to the enclosure wherein the electrical connection is uniformly contacted around a circumference of the outer terminal and an inner circumference of an opening disposed in the enclosure. In some embodiments, the discoidal capacitor may be in a range from 1000 picofarads to 10,000 picofarads.

The method may also include electrically connecting an opposite end of the shielded cable to a ground point using a direct current (DC) connection.

One embodiment of the method may attach the center terminal of the discoidal capacitor to the shield by disposing solder or conductive epoxy at an interface between the discoidal capacitor and the shield around an entire circumference of the interface.

In accordance with an exemplary aspect, the effectiveness of shielded conductors against radiated spurious signals can be improved over single point capacitive grounding or direct current (DC) coupling through the use of a cylindrical capacitor that couples the entire circumference of a cable shield to a grounded element, such as an enclosure housing electrical or electronic circuitry. An inner circumference of the cylindrical or discoidal capacitor may be connected to the shield using solder or conductive epoxy. An outer circumference of the cylindrical capacitor may be connected to the enclosure, using a press fit, conductive epoxy, a spring washer, etc.

DETAILED DESCRIPTION

Although the following text sets forth a detailed description of numerous different embodiments, it should be understood that the legal scope of the description is defined by the words of the claims set forth at the end of this disclosure. The detailed description is to be construed as exemplary only and does not describe every possible embodiment since describing every possible embodiment would be impractical, if not impossible. Numerous alternative embodiments could be implemented, using either current technology or technology developed after the filing date of this patent, which would still fall within the scope of the claims.

It should also be understood that, unless a term is expressly defined in this patent using the sentence "As used herein, the term '________' is hereby defined to mean . . . " or a similar sentence, there is no intent to limit the meaning of that term, either expressly or by implication, beyond its plain or ordinary meaning, and such term should not be interpreted to be limited in scope based on any statement made in any section of this patent (other than the language of the claims). To the extent that any term recited in the claims at the end of this patent is referred to in this patent in a manner consistent with a single meaning, that is done for sake of clarity only so as to not confuse the reader, and it is not intended that such claim term by limited, by implication or otherwise, to that single meaning. Finally, unless a claim element is defined by reciting the word "means" and a function without the recital of any structure, it is not intended that the scope of any claim element be interpreted based on the application of 35 U.S.C. §112, sixth paragraph.

Figure 1:
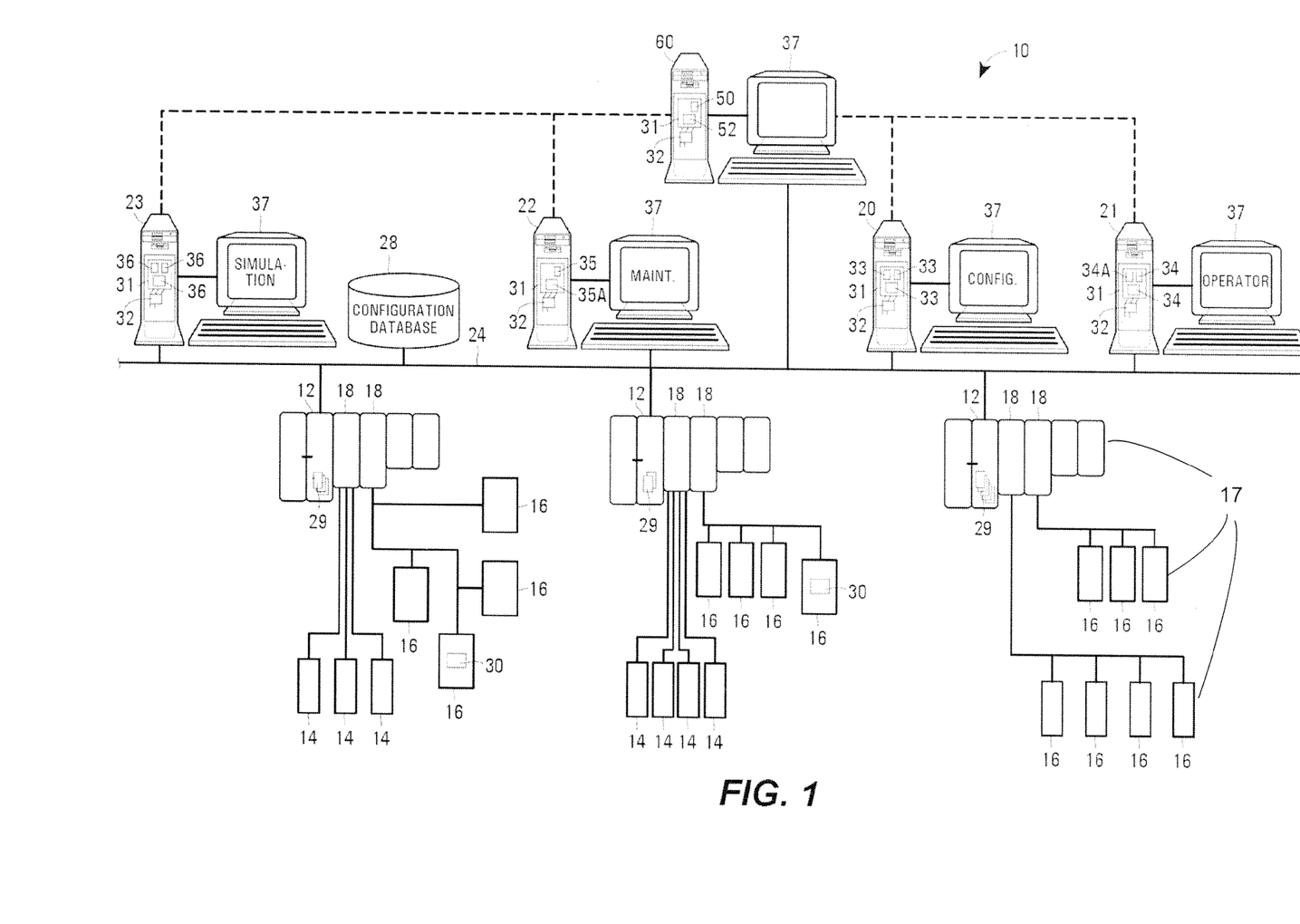
FIG. 1 is a block diagram of a distributed process control network located within a process plant including cabling for control and monitoring equipment in a hostile environment for interference, including both internally generated and externally received radio frequency interference.

FIG. 1 illustrates an example process plant 10. As is typical, the process plant 10 includes a distributed process control system having one or more controllers 12, each connected to one or more field devices 14 and 16 via input/output (I/O) devices or cards 18 which may be, for example, Fieldbus interfaces, Profibus interfaces, HART interfaces, standard 4-20 ma interfaces, etc. Each of the field devices 14, 16, I/O devices or cards 18, and other representative equipment may be housed in an enclosure 17 that has at least one hole for a cable entry point and may be made of a conductive material, such as metal, or may be coated with a conductive coating (not depicted). Such enclosures are common in a process control environment but are equally common in commercial, retail, residential, automotive, appliance, etc., applications. The controllers 12 are also coupled to one or more host or operator workstations 20-23 via a data highway 24 which may be, for example, an Ethernet link. A database 28 may be connected to the data highway 24 and operates as a data historian to collect and store parameter, status and other data associated with the controllers and field devices within the plant 10 and/or as a configuration database that stores the current configuration of the process control system within the plant 10 as downloaded to and stored within the controllers 12 and field devices 14 and 16. While the controllers 12, I/O cards 18 and field devices 14 and 16 are typically located down within and distributed throughout the sometimes harsh plant environment, the operator workstations 20-23 and the database 28 are usually located in control rooms or other less harsh environments easily assessable by controller or maintenance personnel.

As is known, each of the controllers 12, which may be by way of example, the DeltaV™ controller sold by Emerson Process Management, stores and executes a controller application that implements a control strategy using any number of different, independently executed, control modules or blocks 29. Each of the control modules 29 can be made up of what are commonly referred to as function blocks wherein each function block is a part or a subroutine of an overall control routine and operates in conjunction with other function blocks (via communications called links) to implement process control loops within the process plant 10. As is well known, function blocks, which may be objects in an object oriented programming protocol, typically perform one of an input function, such as that associated with a transmitter, a sensor or other process parameter measurement device, a control function, such as that associated with a control routine that performs PID, fuzzy logic, etc. control, or an output function that controls the operation of some device, such as a valve, to perform some physical function within the process plant 10.

In the plant 10 illustrated in FIG. 1, the field devices 14 and 16 connected to the controllers 12 may be standard 4-20 ma devices, may be smart field devices, such as HART, Profibus, or FOUNDATION™ Fieldbus field devices, which include a processor and a memory, or may be any other desired type of devices. Some of these devices, such as Fieldbus field devices (labeled with reference number 16 in FIG. 1), may store and execute modules, or sub-modules, such as function blocks, associated with the control strategy implemented in the controllers 12. Function blocks 30, which are illustrated in FIG. 1 as being disposed in two different ones of the Fieldbus field devices 16, may be executed in conjunction with the execution of the control modules 29 within the controllers 12 to implement process control, as is well known. Of course, the field devices 14 and 16 may be any types of devices, such as sensors, valves, transmitters, positioners, etc. and the I/O devices 18 may be any types of I/O devices conforming to any desired communication or controller protocol such as HART, Fieldbus, Profibus, etc.

In the process plant 10 of FIG. 1, the workstations 20-23 may include various applications that are used for various different functions performed by the same or different personnel within the plant 10. Each of the workstations 20-23 includes a memory 31 that stores various applications, programs, data structures, etc. and a processor 32 which may be used to execute any of the applications stored in the memory 31. In the example illustrated in FIG. 1, the workstation 20 is designated as a configuration workstation and includes one or more configuration applications 33 which may include, for example, control module creation applications, operator interface applications and other data structures which can be accessed by any authorized configuration engineer to create and download control routines or modules, such as the control modules 29 and 30, to the various controllers 12 and devices 16 of the plant 10. The workstation 21 is generally illustrated in FIG. 1 as a control operator viewing workstation and includes a number of display applications 34 which may provide a control operator with various displays during operation of the process plant 10 to enable the operator to view and control what is happening within the process plant 10 or in various sections of the plant. The applications 34 may include support applications 34a such as control diagnostic applications, tuning applications, report generation applications or any other control support applications that may be used to assist a control operator in performing control functions. Similarly, the workstation 22 is illustrated as a maintenance viewing workstation and includes a number of maintenance applications 35 that may be used by various maintenance personnel to view the maintenance needs of the plant 10, to view the operating or working condition of various devices 12, 14, 16, etc. Of course, the applications 35 may include support applications 35a such as maintenance diagnostic applications, calibration applications, vibration analysis applications, report generation applications or any other maintenance support applications that may be used to assist a maintenance person in performing maintenance functions within the plant 10. Additionally, the workstation 23 is indicated as a simulation workstation which includes a number of simulation applications 36 that may be used to simulate operation of the plant 10 or various sections of the plant 10 for any number of purposes, including for training purposes, for plant modeling purposes to assist in plant maintenance and control, etc. As is typical, each of the workstations 20-23 includes a display screen 37 along with other standard peripheral devices, like a keyboard, a mouse, etc.

Of course, while the various configuration, control, maintenance and simulation applications 33-36 are illustrated in FIG. 1 as being located in different workstations dedicated to one of those functions, it will be understood that the various applications 33-36 associated with these or other plant functions may be located in and executed in the same or different workstations or computers within the plant 10, depending on the needs and set up of the plant 10.

A system level workstation 60 may generally store a graphics editor 50 and a database 52. Additionally, the workstation 60 may be communicatively connected to the workstations 20-23 via the databus 24, via separate wired or wireless communication connections (illustrated by dotted lines in FIG. 1) or in any other desired manner.

As illustrated, in FIG. 1, there are numerous cabling requirements associated with network 24 and connections between I/O modules 18 and field devices 16. Plant equipment both illustrated in FIG. 1 and others that are typically found in manufacturing environments are sources of a great deal of radio frequency interference. However, many of those sources, and others as well, are also problematic in commercial and residential environments and may include motors, florescent lights, light dimmers, cell phones, WiFi hotspots, radio and television transmitters, etc. Thus, even though the teachings presented here are particularly applicable to factory environments, their use in other settings such as commercial, retail, and residential are equally applicable.

Figure 2:
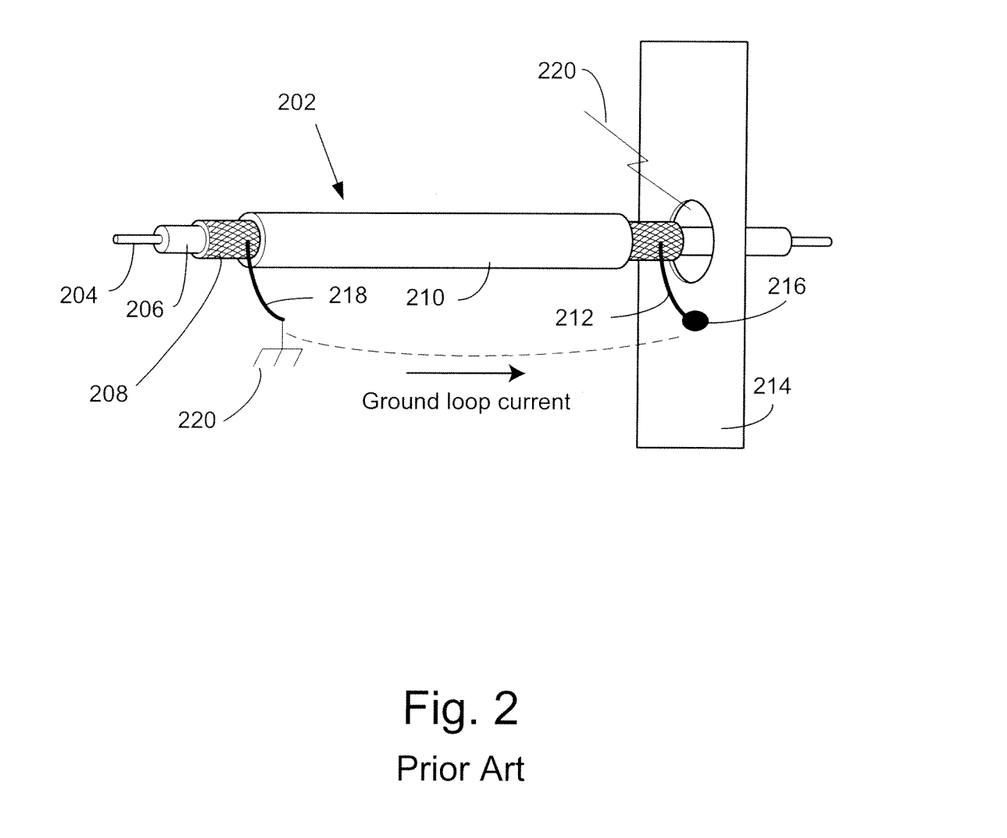
FIG. 2 illustrates a prior art shielded cable installation.

FIG. 2 illustrates one prior art shielded cable installation with shielded cable 202 and a section of an enclosure 214. The enclosure 214 may be electrically conductive and may be a typical six-sided cabinet, housing, electrical panel, computer case, etc. The shielded cable 202 is shown with a single conductor 204 and its associated insulation 206. In most embodiments, there will be additional conductors or conductor pairs in the shielded cable 202, but for the sake of simplicity, a single conductor is shown. A shield 208 and outer insulation 210 are shown completely surrounding the conductor 204, 206. The shield 208 may be a braided sheath of small wires/filaments or may be foil wrapped around the wire in an overlapping pattern. Other embodiments of shield construction are possible. In the embodiments described, the shield 208 is not used as a signal return for any conductor(s).

A drain wire 212 may be used to couple the shield to an external component such as grounding point 216 of the enclosure 214. Drain wires can be wires physically attached to the shield or may be a length of braided sheath that is unwoven from its cable and uses as a wire for connections. Drain wires may be attached to a ground point, e.g. connection point 216. The opposite end of the cable may be attached through an additional drain wire 218 to a signal or earth ground 220. While grounding the shield at both ends with a direct current (DC) connection can be effective at preventing stray signals from being coupled onto the shield 208, this is rarely done because ground loop currents can be set up between the connected pieces of equipment. Ground loops may affect the accuracy of the voltage being transmitted on the conductor 204, among other undesired effects.

As effective as the shield 208 may be in preventing RF from being coupled to the conductor, a strain relief fitting (a plastic fitting used to mechanically couple the cable 202 to the enclosure 214, which is not shown for clarity), does not provide any electrical protection from stray RF, particularly high frequency RF, from being admitted through the opening in the enclosure. Metal strain relief fittings coupled to the shield can only provide DC coupling of the shield to the enclosure. Filtering of signal conductors 204 using, for example, feedthrough mounts may help prevent interference from being conducted to or from a circuit but do not address effectiveness of the shield 208 or gaps in the enclosure 214 at the cable entry point.

Figure 3:
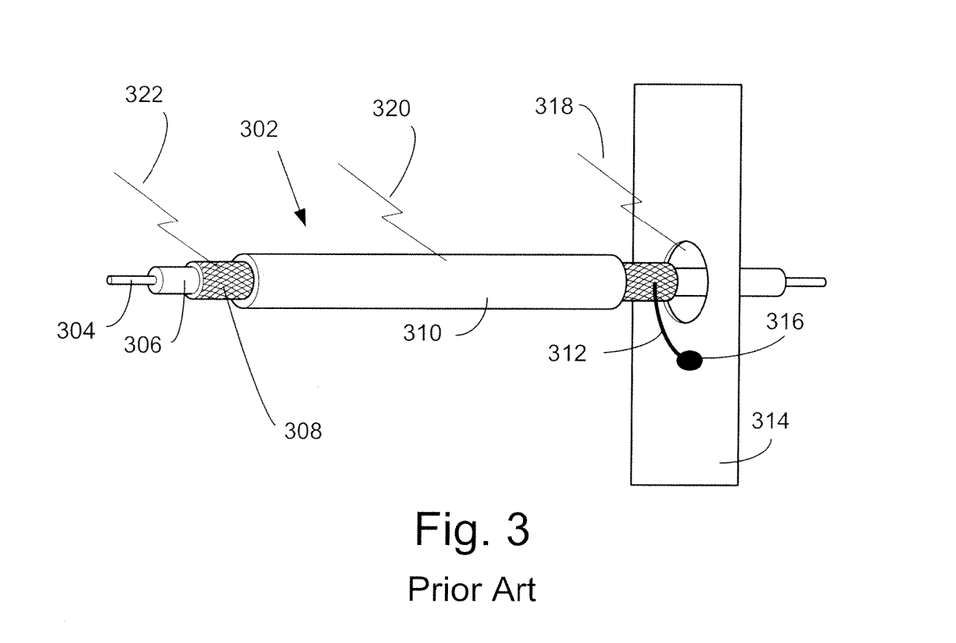
FIG. 3 illustrates a prior art shielded cable installation that addresses ground loops.

FIG. 3 illustrates a common embodiment used to prevent ground loop currents from occurring. The cable 302 is shown having conductor 304, insulation 306, shield 308, and an outer insulator 310. A drain wire 312 may be connected to the enclosure 314 at grounding point 316. While grounding the shield at only one end of the cable will prevent ground loops it greatly reduces the effectiveness of the shield 108 because without the remote end termination, the shield can act as an antenna to couple RF energy 320 and 322. Also, the electrically transparent opening in the enclosure 314 is still susceptible to RF energy 318 incursion.

Figure 4:
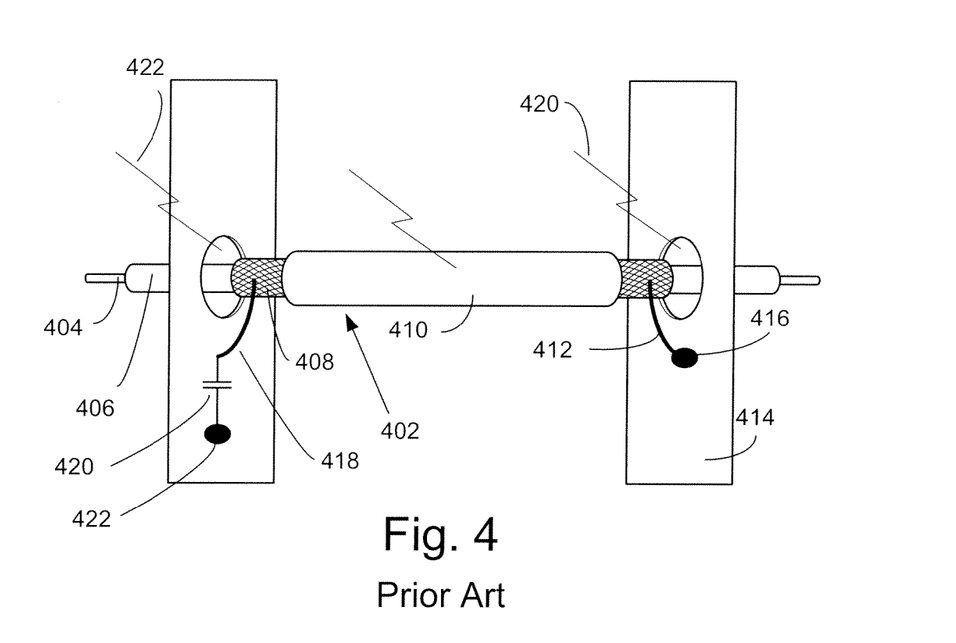
FIG. 4 illustrates another prior art shielded cable installation.

FIG. 4 illustrates a way to prevent ground loops and maintain the ability for a shield to block electromagnetic interference. The cable 402 with conductor 404 and insulation 406 has shield 408 DC coupled through a first drain wire 412 to the enclosure 414 at grounding point 416. The other end of the cable may be AC coupled to a connecting piece of equipment through drain wire 418 and capacitor 420. This AC coupled termination creates a low impedance connection at AC frequencies. This method works at low frequencies but at higher frequencies, e.g., above 100 MHz, the impedance of the path through the drain wire 418, capacitor 420, and terminal 422 may be so high that the benefit of the connection of the shield is significantly reduced. The capacitor 420 may be a leaded capacitor, adding to an inductive component to the capacitor. At very high frequencies this connection performs the same as if the cable 402 were grounded on one end only and no connection was made through the capacitor 420. Aside from having a high impedance connection, the openings in both enclosures remain a point for interference 420 and 422 to enter the enclosure because, as above, this method of landing the drain wire of the shield provides minimal means for blocking interference at the wire entry point.

Figure 5:
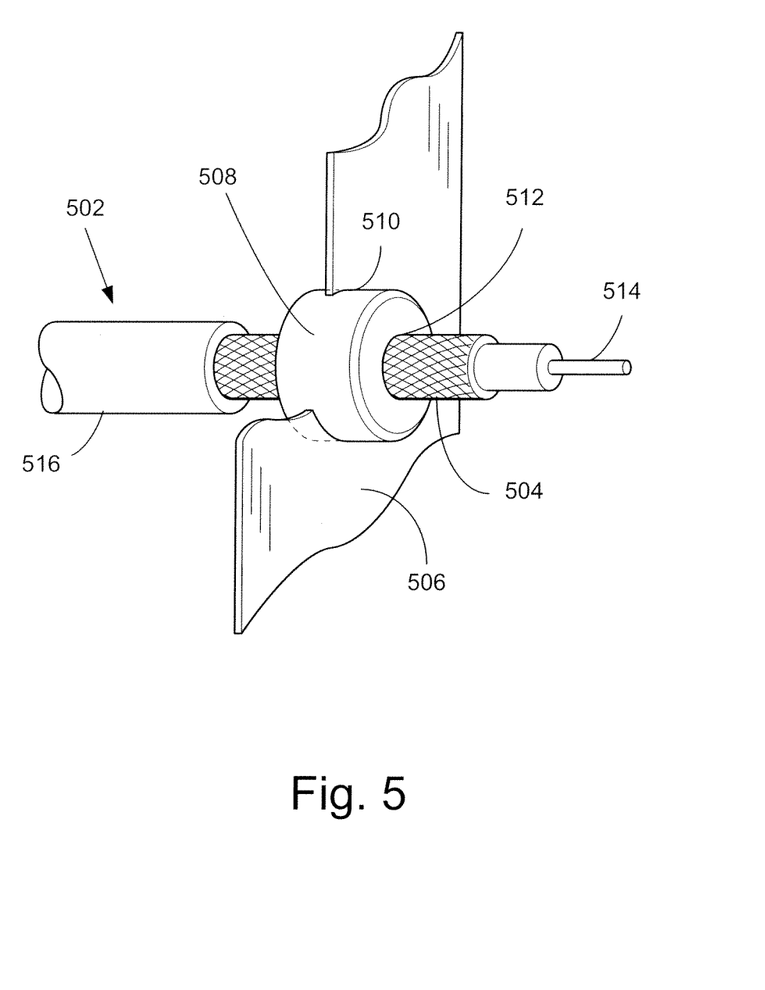
FIG. 5 illustrates an embodiment for terminating the shield of a cable in accordance with the current disclosure.

FIG. 5 illustrates an embodiment for terminating one end of a shield 504 of a cable 502 that provides better high frequency protection than the capacitor and drain wire-terminated embodiment of FIG. 4 and at the same time effectively covers the cable opening from stray RF signals in a wall 506 of an enclosure, such as any of the forms of enclosure 17 discussed above. As in prior art embodiments, the cable 502 may be one or more insulated conductors 514 and an outer insulator 516 that surrounds the shield in a coaxial manner. A cylindrical, discoidal, or tubular capacitor 508 may be electrically and mechanically coupled to an opening in the wall 506 of the enclosure 17 at an outer circumference of the cylindrical capacitor 508. The connection at circumference 510 may be a press fit, may be a solder attachment or connection, or may use a conductive epoxy to continuously attach the cylindrical capacitor 508 to the wall 506 of the enclosure 17.

The shape of the capacitor 508 may be a geometric section of a cylinder, that is, a disk, cylinder or tube. A common feature of capacitors in this family is that one of the electrical terminals is at an inner edge or center surface of the cylinder, tube, or disk, and the other electrical terminal is at an outer edge or outer surface of the cylinder, tube or disk. Another feature of this capacitor is that the capacitive body, e.g. conductive plates, are arranged so that the capacitance between terminals is radially oriented around the entire cylinder, as opposed to, for example, a single disk capacitor soldered over an insulated washer at one radius.

Similarly, the shield 504 may be connected at circumference 512 to an inner circumference of the cylindrical capacitor 508 at an exposed portion of the shield. A separate mechanical strain relief (not depicted) may be added, if needed. In some embodiments, capacitors in the range of 1000 to 10,000 picofarads may provide the desired low impedance at high frequencies, e.g., frequencies approaching or above 100 MHz. Because this embodiment eliminates the drain wire, such as drain wire 418, the inductance of the drain wire is eliminated, easing compliance with some certifications.

While cylindrical or discoidal capacitors are available from commercial suppliers, such as Syfer of Norwich, UK, standard commercially available products are only available for inner diameters that accommodate a single conductor, not a shield of a cable, as illustrated. A multi-layer printed circuit board with alternating plates coupled to the inner and outer plated edges coupled to the respective alternating plates is one way of making a discoidal capacitor. This technique allows a capacitor with a large inner diameter terminal to be manufactured. Other techniques, such as current ceramic-based techniques, may be modified to accommodate large inner diameter requirements of the current embodiment.

Figure 6:
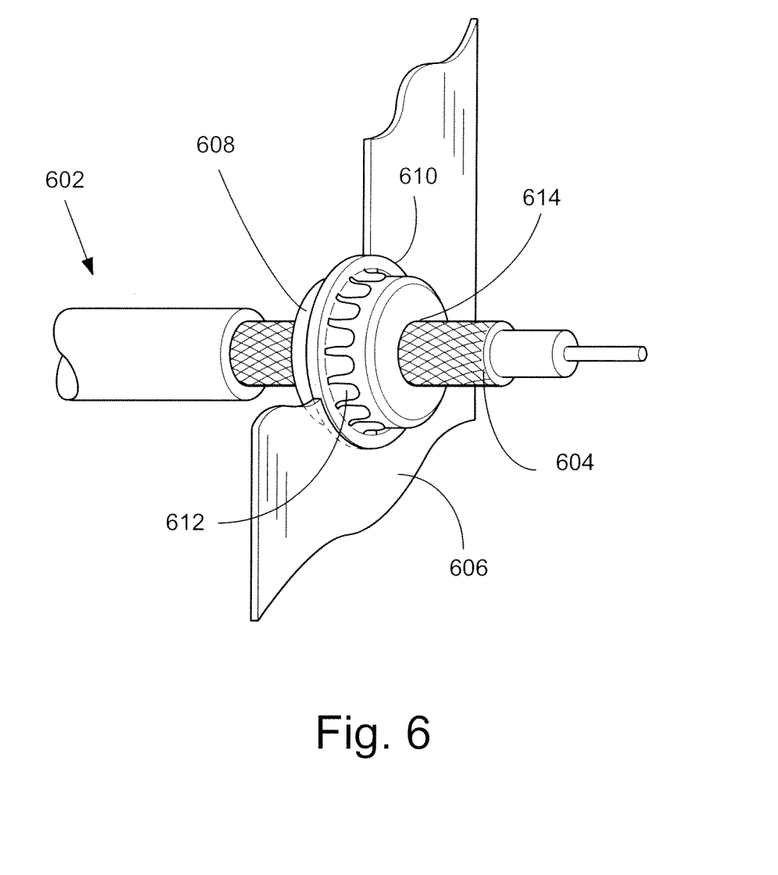
FIG. 6 illustrates another embodiment for terminating the shield of a cable in accordance with the current disclosure.

FIG. 6 illustrates an alternate method of terminating a shield 604 of a cable 602 that, like the embodiment of FIG. 5, provides better high frequency protection from RF interference over prior art methods. A cylindrical capacitor 608 may coaxially aligned with and may be inserted into a spring washer 612 that provides substantially continuous electrical contact between the cylindrical capacitor 608 and the washer 612 around their entire circumferences. The washer 612 itself may be press fit, soldered, or epoxied to the enclosure 606 at the spring washer's outer circumference 610. As above, the shield 604 may be electrically connected to an inner circumference 614 of the cylindrical capacitor 608. The spring washer 612 has small gaps between its fingers, but these gaps are so small as to not be of concern with respect to passing RF interference at frequencies of concern. That is, even though the gaps may pass certain extremely high frequencies, there is not a significant number of sources of such extreme frequencies, particularly at power levels of concern. The result is that the spring washer 612, or other electrical connections that have gaps too small to pass RF frequencies of interest provide a substantially continuous contact around the outer and inner circumferences of the cylindrical, discoidal, or tubular capacitor 608.

Figure 7:
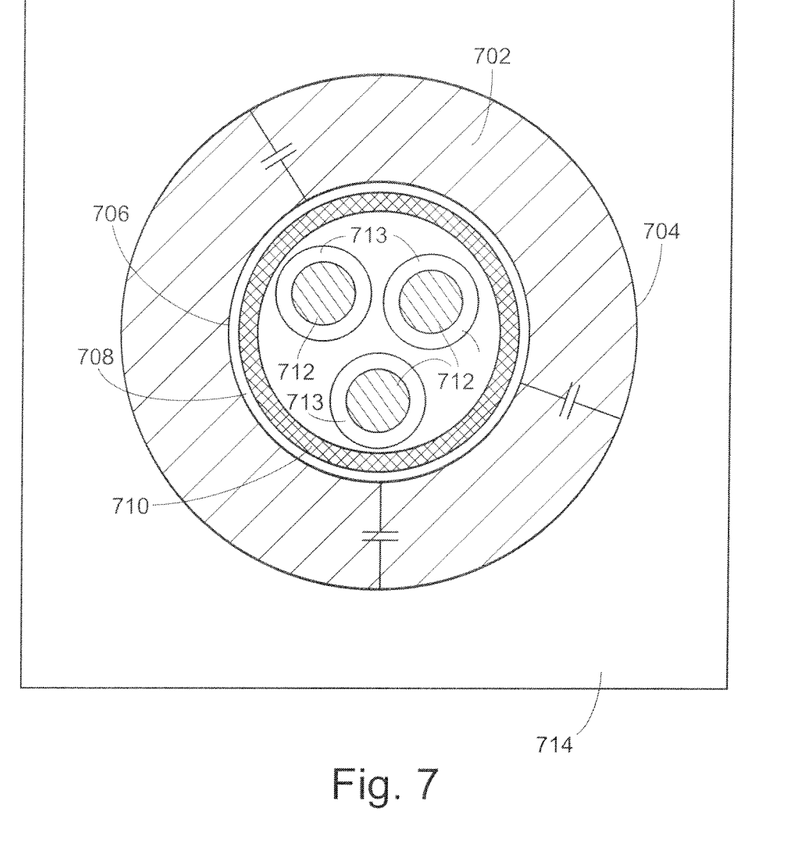
FIG. 7 illustrates a cross-section view of the embodiment of FIG. 5.

FIG. 7 shows a cross section view of a discoidal or cylindrical capacitor 702 mounted in an enclosure wall 714, as may be found in the embodiment of FIG. 5. A first terminal 704 of the capacitor 702 is coaxially disposed around an outer circumference of the discoidal capacitor 702 and is in substantially continuous electrical contact with the enclosure wall 714 around an inner surface of an opening in the enclosure wall 714. A second terminal 706 of the capacitor is exposed around an inner circumference of the discoidal capacitor 702 may be in substantially continuous electrical contact with a shield 710 of a cable at connection interface 708. The connection interface 708 may be simple mechanical fit, but some embodiments may use a solder connection or conductive epoxy around the entire circumference between the shield 710 and the second terminal 706. The cable may have having inner conductors 712, each with its own insulation 713. The discoidal or cylindrical capacitor 702 provides an effectively continuous capacitive (AC coupling) of the shield 710 to the enclosure wall 714 around the entire circumference of the shield 710. This affords an effective low impedance RF coupling for a range of frequencies up to 100 MHz or more, even into the low gigahertz (GHz) range, with a minimal inductive component. The capacitor symbols shown in the capacitor 702 merely indicate that its capacitive effect is uniformly distributed around the 360 degree arc of the discoidal or cylindrical capacitor 702.

Other cross-sections of capacitor are possible, for example, some columnar capacitors have square cross-sections with inner and outer terminals still disposed at inside and outside edges. The use of this type of capacitor is possible when the demands of the application indicate such as square tube design. However, better performance may be achieved with a cylindrical design.

Figure 8:
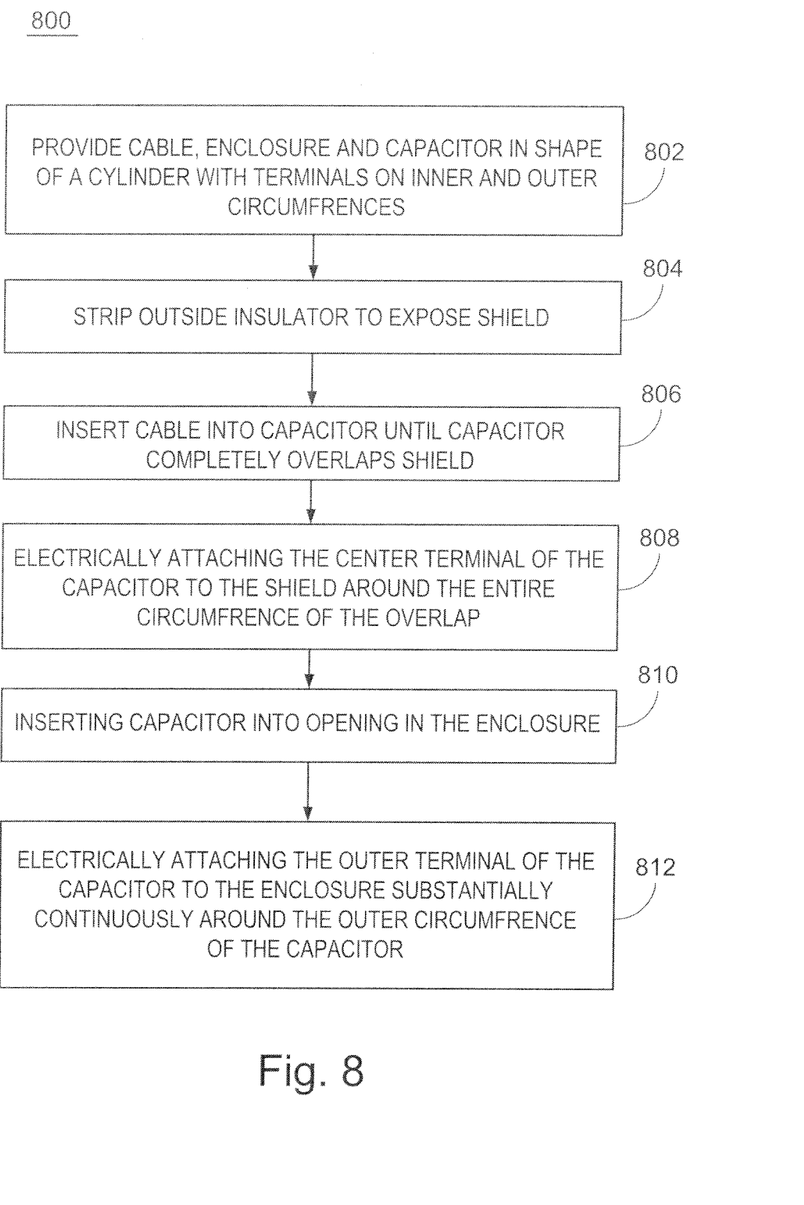
FIG. 8 illustrates a method of terminating a shield of a cable to an enclosure.

FIG. 8 is a flow chart of a method 800 of terminating a shield of a cable to an enclosure. At block 802, a cable 502 with shield 504, an enclosure 506 with an opening through which the cable may pass, and a cylindrical capacitor 508 having a first terminal disposed around an inner circumference and a second terminal disposed around an outer circumference of the capacitor.

At block 804, an outer insulation of the cable 508 may be removed to expose the shield 504.

At block 806, the cable 502 may be inserted into the cylindrical capacitor 508 until the capacitor 508 completely overlaps the shield 504. In some embodiments, the shield may completely penetrate the capacitor, but the desired effect can be achieved by having at least the entire circumference of the shield in contact with the circumference of the capacitor so that there is substantial contact between the two components around both circumferences.

At block 808, the inner, or center, terminal of the cylindrical capacitor 508 may be electrically attached to the shield 504. As discussed above, many alternatives may be used, such as solder or conductive epoxy.

At block 810, the capacitor may be inserted into a suitably-sized hole in the enclosure 506. When a spring washer 612 or other intermediary device is used, the spring washer 612 may first be attached to either the capacitor 508 or the enclosure 506 prior to final assembly.

At block 812, the outer terminal of the cylindrical capacitor 508 may be electrically attached to the capacitor to form a substantially continuous electrical connection around a circumference of the opening in the enclosure 506 and an outer terminal of the cylindrical capacitor 508.

Of course, there is no particular preference to the order in which the capacitor 508, the cable shield 504, and enclosure 506 are assembled.

Although the foregoing text sets forth a detailed description of numerous different embodiments of the invention, it should be understood that the scope of the invention is defined by the words of the claims set forth at the end of this patent. The detailed description is to be construed as exemplary only and does not describe every possibly embodiment of the invention because describing every possible embodiment would be impractical, if not impossible. Numerous alternative embodiments could be implemented, using either current technology or technology developed after the filing date of this patent, which would still fall within the scope of the claims defining the invention.

Thus, many modifications and variations may be made in the techniques and structures described and illustrated herein without departing from the spirit and scope of the present invention. Accordingly, it should be understood that the methods and apparatus described herein are illustrative only and are not limiting upon the scope of the invention.

I claim:

1. An apparatus for terminating a shield of a cable to an enclosure comprising:
    the cable having one or more insulated conductors and the shield disposed to surround the one or more insulated conductors;
    the enclosure having a first wall, wherein the first wall has an opening through which the cable is passed, the enclosure being electrically conductive at the opening;
    a capacitor in a cylindrical or tube shape having i. a first terminal disposed around an inner circumference of the capacitor wherein the first terminal of the capacitor is in substantially continuous contact with the shield of the cable at an outer circumference of the shield; and ii. a second terminal disposed around an outer circumference of the capacitor wherein the second terminal of the capacitor is in substantially continuous contact at an inner circumference of the opening in the enclosure, forming an electrical connection between the capacitor and the enclosure.

2. The apparatus of claim 1, wherein the capacitor has a capacitance range of 1000 picofarads (pf) to 10,000 pf.

3. The apparatus of claim 1, wherein the substantially continuous contact of the first terminal of the capacitor to the shield of the cable comprises a solder attachment of the first terminal and the shield of the cable around the outer circumference of the shield.

4. The apparatus of claim 1, wherein the substantially continuous contact of the second terminal of the capacitor comprises a press fit of the second terminal to fingers of a spring washer, wherein the fingers of the spring washer are disposed around an inner circumference of the spring washer and an outer circumference of the spring washer is uniformly coupled both electrically and mechanically to an inner face of the opening in the enclosure around the inner circumference of the opening in the enclosure.

5. The apparatus of claim 1, wherein the substantially continuous contact of the second terminal of the capacitor comprises a press fit of the second terminal to an inner face of the opening in the enclosure around the inner circumference of the opening.

6. The apparatus of claim 1, wherein the substantially continuous contact of the second terminal of the capacitor comprises a solder attachment of the second terminal to an inner face of the opening in the enclosure around the inner circumference of the opening.

7. The apparatus of claim 1, wherein the shield of the cable is a braided electrical filament sheath or a foil wrapper.

8. The apparatus of claim 1, wherein the substantially continuous contact of the first terminal of the capacitor comprises a conductive epoxy attachment of the first terminal and the shield of the cable around the outer circumference of the shield.

9. A method of terminating a shield of a cable comprising:
    providing the cable having one or more insulated conductors, the shield that surrounds the insulated conductors along a length of the cable, and an outer insulator that surrounds the shield;
    providing an enclosure having sides with at least one side having an opening;
    providing a capacitor in a shape of a cylinder with a center terminal at an inner circumference of the cylinder and a outer terminal at an outer circumference of the cylinder, wherein an inner diameter of the capacitor is approximately equal to an outer diameter of the shield;
    stripping the outer insulator at one end of the cable to expose the shield;

inserting the cable into the capacitor until an exposed portion of the shield overlaps the center terminal of the capacitor around a circumference of the shield;

electrically attaching the center terminal of the capacitor to the shield around a circumference of overlap between the center terminal and the shield;

inserting the capacitor into the opening in the at least one side of the enclosure; and electrically attaching the outer terminal of the capacitor to the at least one side of the enclosure substantially continuously around an outer circumference of the capacitor.

10. The method of claim 9, wherein electrically attaching the center terminal of the capacitor to the shield around the circumference of overlap between the center terminal and the shield comprises disposing a substantially continuous solder connection between the center terminal and the shield.

11. The method of claim 9, wherein electrically attaching the center terminal of the capacitor to the shield around the circumference of overlap between the center terminal and the shield comprises disposing a substantially continuous conductive epoxy connection between the center terminal and the shield.

12. The method of claim 9, wherein electrically attaching the outer terminal of the capacitor to the enclosure substantially continuously around the outer circumference of the capacitor comprises fitting a spring washer to the opening of the enclosure such that fingers of the spring washer electrically and mechanically contact the outer terminal of the capacitor at intervals around the outer circumference of the capacitor.

13. The method of claim 9, wherein electrically attaching the outer terminal of the capacitor to the enclosure substantially continuously around the outer circumference of the capacitor comprises press fitting the outer terminal of the capacitor into the opening of the enclosure.

14. The method of claim 9, wherein electrically attaching the outer terminal of the capacitor to the enclosure substantially continuously around the outer circumference of the capacitor comprises disposing the capacitor in the opening of the enclosure and disposing a substantially continuous solder connection between the outer terminal of the capacitor to the enclosure around the outer circumference of the capacitor.

15. The method of claim 9, wherein electrically attaching the outer terminal of the capacitor to the enclosure substantially continuously around the outer circumference of the capacitor comprises disposing the capacitor in the opening of the enclosure and disposing a substantially continuous conductive epoxy connection between the outer terminal of the capacitor to the enclosure around the outer circumference of the capacitor.

16. A method of providing an AC coupled termination of a shielded cable to an enclosure using a capacitor in the shape of a cylinder, disk, or tube with terminals at a center circumference and an outer circumference of the capacitor, the method comprising:

providing the shielded cable having one or more inner conductors and a shield that cylindrically encloses the one or more inner conductors;

at one end of the shielded cable, attaching a center terminal of the capacitor to the shield so that the center terminal is in continuous electrical contact with the shield around a circumference of the shield perpendicular to the one or more inner conductors;

electrically connecting an outer terminal of the discoidal capacitor to the enclosure wherein the electrical connection is uniformly contacted around a circumference of the outer terminal and an inner circumference of an opening disposed in the enclosure.

17. The method of claim 16, wherein the capacitor is in a range from 1000 picofarads to 10,000 picofarads.

18. The method of claim 16, further comprising electrically connecting an opposite end of the shielded cable to a ground point using a direct current (DC) connection.

19. The method of claim 18 wherein attaching the center terminal of the capacitor to the shield comprises disposing solder or conductive epoxy at an interface between the capacitor and the shield around an entire circumference of the interface.

\* \* \* \* \*

UNITED STATES PATENT AND TRADEMARK OFFICE
CERTIFICATE OF CORRECTION

PATENT NO. : 8,963,015 B2  Page 1 of 1
APPLICATION NO. : 13/008622
DATED : February 24, 2015
INVENTOR(S) : Adam Joseph Wittkop It is certified that error appears in the above-identified patent and that said Letters Patent is hereby corrected as shown below:

Title Page, Item (73) Assignee line 2, "ID" should be -- IA --.

Signed and Sealed this
Fifth Day of April, 2016

Michelle K. Lee
*Director of the United States Patent and Trademark Office*